United States Patent
Hatakeyama et al.

(10) Patent No.: US 6,790,586 B2
(45) Date of Patent: Sep. 14, 2004

(54) RESIST COMPOSITIONS AND PATTERNING PROCESS

(75) Inventors: Jun Hatakeyama, Kubiki-mura (JP); Yuji Harada, Kubiki-mura (JP); Jun Watanabe, Kubiki-mura (JP); Yoshio Kawai, Kubiki-mura (JP); Masaru Sasago, Osaka (JP); Masayuki Endo, Osaka (JP); Shinji Kishimura, Itami (JP); Michitaka Ootani, Kawagoe (JP); Satoru Miyazawa, Kawagoe (JP); Kentaro Tsutsumi, Kawagoe (JP); Kazuhiko Maeda, Tokyo (JP)

(73) Assignees: Shin-Etsu Chemical Co., Ltd., Tokyo (JP); Matsushita Electric Industrial Co., Ltd., Osaka (JP); Central Glass Co., Ltd., Yamaguchi (JP)

( * ) Notice: Subject to any disclaimer, the term of this patent is extended or adjusted under 35 U.S.C. 154(b) by 237 days.

(21) Appl. No.: 09/947,504

(22) Filed: Sep. 7, 2001

(65) Prior Publication Data

US 2002/0051935 A1 May 2, 2002

(30) Foreign Application Priority Data

Sep. 7, 2000 (JP) .................................. 2000-271202

(51) Int. Cl.$^7$ .......................... G03F 7/038; G03F 7/38; G03F 7/40; G03F 7/30
(52) U.S. Cl. .................. 430/270.1; 430/320; 430/322; 430/905; 430/907
(58) Field of Search ........................ 430/270.1, 320, 430/322, 905, 907

(56) References Cited

U.S. PATENT DOCUMENTS

| | | | | | |
|---|---|---|---|---|---|
| 5,968,712 A | * | 10/1999 | Thackeray et al. | ......... | 430/326 |
| 6,045,970 A | * | 4/2000 | Choi | ........................ | 430/270.1 |
| 6,090,518 A | * | 7/2000 | Niinomi et al. | .............. | 430/170 |
| 6,369,143 B1 | * | 4/2002 | Park et al. | .................... | 524/157 |
| 6,399,274 B1 | * | 6/2002 | Kinsho et al. | ............ | 430/270.1 |
| 6,492,090 B2 | * | 12/2002 | Nishi et al. | .............. | 430/270.1 |
| 6,509,135 B2 | * | 1/2003 | Nishi et al. | .............. | 430/270.1 |
| 6,512,067 B2 | * | 1/2003 | Nishi et al. | .................. | 526/266 |
| 6,524,765 B1 | * | 2/2003 | Nishi et al. | .............. | 430/270.1 |
| 6,566,037 B2 | * | 5/2003 | Nishi et al. | .............. | 430/270.1 |
| 6,566,038 B2 | * | 5/2003 | Nishi et al. | .............. | 430/270.1 |
| 6,582,880 B2 | * | 6/2003 | Harada et al. | ........... | 430/270.1 |
| 2002/0001772 A1 | * | 1/2002 | Nishi et al. | .............. | 430/270.1 |
| 2002/0061463 A1 | * | 5/2002 | Nishi et al. | .............. | 430/270.1 |
| 2002/0102493 A1 | * | 8/2002 | Nishi et al. | .............. | 430/270.1 |
| 2002/0132182 A1 | * | 9/2002 | Nishi et al. | .............. | 430/270.1 |
| 2003/0013039 A1 | * | 1/2003 | Kobayashi et al. | ...... | 430/270.1 |
| 2003/0036016 A1 | * | 2/2003 | Szmanda et al. | ......... | 430/270.1 |
| 2003/0087181 A1 | * | 5/2003 | Nishi et al. | .............. | 430/270.1 |

FOREIGN PATENT DOCUMENTS

| | | |
|---|---|---|
| JP | B 2-27660 | 6/1990 |
| JP | A 63-27829 | 11/1994 |
| JP | A 9-73173 | 3/1997 |
| JP | A 9-230595 | 9/1997 |
| JP | A 10-10739 | 1/1998 |
| WO | WO 97/33198 | 9/1997 |

* cited by examiner

Primary Examiner—Yvette C. Thornton
(74) Attorney, Agent, or Firm—Miller, White, Zelano, Branigan, P.C.

(57) ABSTRACT

A resist composition comprising (A) a polymer comprising recurring units having an alicyclic hydrocarbon backbone to which a carboxylate moiety capable of generating carboxylic acid when decomposed under acidic conditions is attached through a C1–C20 alkylene spacer, (B) a photoacid generator, and (C) an organic solvent is sensitive to high-energy radiation, and has excellent sensitivity and resolution at a wavelength below 180 nm, and good plasma etching resistance. Because these features of the inventive resist composition enable its use particularly as a resist at the exposure wavelength of a $F_2$ excimer laser, a finely defined pattern can easily be formed, making the resist ideal as a micropatterning material in VLSI fabrication.

11 Claims, 1 Drawing Sheet

RESIST COMPOSITIONS AND PATTERNING PROCESS

This invention relates to a process for forming a resist pattern using exposure radiation having a wavelength below 180 nm, and a resist composition suited therefor.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF laser (248 nm) brought about a significant innovation, promising a possibility of commercial manufacture of devices on 0.18-micron rule. To the demand for a resist material with a higher resolution and sensitivity, acid-catalyzed chemical amplification positive working resist materials are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated. With a wavelength reduction from KrF to ArF laser (193 nm), it is expected to enable miniaturization of the design rule to 0.13 µm or less. Since conventionally used novolac resins and poly(vinyl phenol) resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ excimer laser (157 nm) which is expected to enable further miniaturization to 0.10 µm or less, more difficulty arises in insuring transparency because it was found that acrylic resins are not transmissive to light at all and those cycloolefin resins having carbonyl bonds have strong absorption. It was also found that poly(vinyl phenol) is somewhat improved in transmittance near 160 nm, but far below the practical level. It was found that reducing carbonyl and carbon-to-carbon double bonds is essential for insuring a transmittance. However, ring structures and carbon-to-carbon double bonds greatly contribute to an improvement in dry etching resistance. Polymers for ArF exposure in which benzene rings are excluded and instead, alicyclic structures are introduced for improving etching resistance are difficult to acquire transparency because their solubility resorts to carboxylic acid.

At present, reduction projection aligners having F2 laser mounted therein were developed and have just been marketed by Excitech in UK and Ultratech Stepper, Inc. in USA. However, they are not yet common, and under such circumstances, no frequent exposure experiments can be carried out. Then we analyzed the dissolution characteristics of resists upon exposure to $F_2$ excimer laser light using a simulating illumination tool VUVES of Litho Tech Japan Corp. It was found that what becomes a problem as a result of wavelength reduction is a lowering of transparency, and in the case of a positive resist material, a negative working phenomenon that the exposed areas become insoluble as the dose of exposure is increased. Those portions which have turned negative are insoluble not only in alkali developers, but also in organic solvents such as acetone. This indicates that gel forms as a result of crosslinking of molecules together. Radical generation is presumably one cause of crosslinking. As a result of wavelength reduction, the exposure energy is increased so that even C—C bonds and C—H bonds may be excited in the case of $F_2$ exposure (157 nm). As a result of excitation, radicals are generated with a possibility that molecules unite together. For polymers having an alicyclic structure for use in ArF exposure, for example, polynorbornene, an outstanding negative working phenomenon was observed. It is believed that these polymers have a structure susceptible to crosslinking since the alicyclic group has many C—H bonds at the bridgehead. On the other hand, it is well known that α-methylstyrene and derivatives thereof are effective for preventing crosslinking. Alpha-methylstyrene can mitigate the negative working phenomenon, but fail to completely eliminate the phenomenon. Moreover, since oxygen absorption is considerable in the VUV region, exposure is effected under the conditions that oxygen is purged, with an inert gas such as nitrogen or argon, to an oxygen concentration of 1 ppm or lower. Since oxygen is an effective radical trapping agent, this means that the radicals generated have a long lifetime and more crosslinking takes place. Among various resist polymers, an outstanding negative turning phenomenon was observed with resist materials using hydroxystyrene polymers as the base. In contrast, the negative turning phenomenon was scarcely observed with resist materials using acrylate polymers as the base. The resist materials based on acrylate polymers afford a fully high gamma value although they are non-fluorinated and low transparent. Then, we attempted to form a pattern by forming a mask on a $MgF_2$ substrate, placing it in close contact with a resist film and irradiating by means of the tool VUVES. For the acrylate-based resist materials having a fully high y value, patterns with substantially perpendicular sidewalls were observed. It was thus confirmed that resists having a high contrast as demonstrated by a γ in excess of 10 can form rectangular patterns although they are not so highly transparent.

It was found that alternating copolymers of a norbornene monomer having an acid labile group-bearing ester group directly bonded thereto with maleic anhydride are practically unacceptable in the event of $F_2$ laser exposure, because they are very low in sensitivity and contrast (γ) as compared with the acrylic polymer resists.

In most cases, dry etching resistance is conventionally discussed in conjunction with the selection ratio of etching. As described in many reports, for example, J. Photopolymer Sci. and Technol., Vol. 5, No. 3 (1992), p. 439, J. Electrochem. Soc.: Solid-State Sci. and Technol., Vol. 130, No. 1, January 1983, p. 143, and SPIE, Vol. 2724, p. 365 (1996), engineers attempted to express the dry etching selectivity of a single layer resist using various parameters. Typical are Onishi parameter and ring parameter.

It was recently reported in SPIE, Vol. 3678, p. 1209 (1999) that micro-roughness develops on the resist surface after dry etching and is transferred after substrate processing and resist removal.

Making extensive studies, we found that the development of roughness after etching is observed when dry etching of $SiO_2$ is carried out with a fluorocarbon gas such as $CF_4$, $CHF_3$, $C_2F_6$, $C_3F_8$ or $C_4F_{10}$ and that roughness increases under the high throughput conditions where the RF power is increased for high selectivity etching, that is, fast etching of oxide film. It was further found that roughness largely differs depending on the type of polymer used in ArF single layer resist. A noticeable roughness develops with acrylic polymers. In contrast, roughness declines with cycloolefin polymers such as norbornene homopolymers and alternating copolymers of norbornene with maleic anhydride. In particular, norbornene homopolymers give small values of roughness even compared with polyhydroxystyrene for KrF. Acrylic polymers with pendant adamantane exhibit a satisfactory value of etching speed, that is, selection ratio, fully comparable to cycloolefin polymers. When high selectivity etching was effected in an etching speed ratio of at least 3 between oxide film and resist, the surface roughness Rms of the etched surface as measured by atomic force microscope (AFM) was more than 15 nm for acrylic polymers and less than 3 nm for cycloolefin polymers. These results indicate that the selection ratio of etching does not necessarily coincide with the roughness after etching.

SUMMARY OF THE INVENTION

An object of the invention is to provide a resist composition which has a high transmittance to vacuum ultraviolet radiation below 180 nm, especially an $F_2$ excimer laser beam (157 nm), $Kr_2$ excimer laser beam (146 nm), KrAr excimer laser beam (134 nm) and $Ar_2$ excimer laser beam (121 nm), as well as improved negative conversion-preventing effect, good dry etching resistance and minimized surface roughness after etching. Another object is to provide a patterning process using the same.

We have found that a polymer of an alicyclic hydrocarbon backbone such as norbornene, tricyclododecene or tetracyclododecene ring and having an acid-eliminatable ester group attached to the ring can be improved in acid elimination ability by introducing a spacer such as alkylene between the alicyclic hydrocarbon backbone and the acid-eliminatable ester group, and that using this polymer as a base resin, the above-discussed problems associated with exposure at a wavelength below 180 nm, especially $F_2$ excimer laser can be overcome.

In one aspect, the invention provides a resist composition adapted for exposure to high-energy radiation having a wavelength below 180 nm, comprising (A) a base resin in the form of a polymer comprising recurring units having an alicyclic hydrocarbon backbone to which a carboxylate moiety capable of generating carboxylic acid when decomposed under acidic conditions is attached via 1 to 20 carbon atoms, (B) a photoacid generator, and (C) an organic solvent.

Preferably, the base resin (A) is a polymer of a norbornene derivative, tricyclododecene derivative or tetracyclododecene derivative.

Further preferably, the base resin (A) is a polymer comprising recurring units of the following formula (1), (2) or (3).

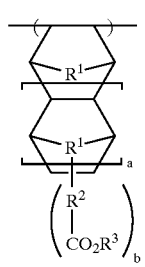
(1)

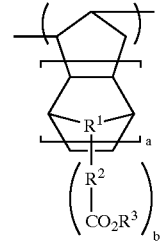
(2)

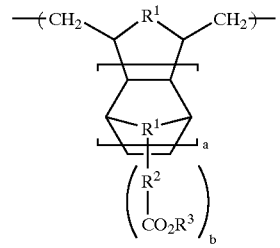
(3)

Herein $R^1$ is methylene, oxygen or sulfur, $R^2$ is a straight, branched or cyclic alkylene group of 1 to 20 carbon atoms which may contain a hetero atom such as oxygen, nitrogen or sulfur to form a hydroxy, alkoxy, acetyl or ester group, $R^3$ is an acid labile group, "a" is 0 or 1, and "b" is 1 or 2.

In a preferred embodiment, the acid labile group represented by $R^3$ in formulae (1) to (3) is a fluorinated acid labile group of the following general formula (4).

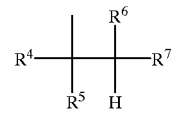
(4)

Herein $R^4$, $R^5$, $R^6$ and $R^7$ each are hydrogen, fluorine, or a straight, branched or cyclic alkyl or fluorinated alkyl group of 1 to 20 carbon atoms, and at least one of $R^4$, $R^5$, $R^6$ and $R^7$ contains fluorine.

In a further preferred embodiment, the resist composition further includes a basic compound, a dissolution inhibitor and/or a dissolution improver.

In another aspect, the invention provides a process for forming a resist pattern comprising the steps of applying the resist composition onto a substrate to form a coating; heat treating the coating and then exposing it to radiation having a wavelength below 180 nm through a photo mask; and optionally heat treating the exposed coating and developing it with a developer.

BRIEF DESCRIPTION OF THE DRAWING

The only figure.

DESCRIPTION OF THE PREFERRED EMBODIMENT

Figure 1:
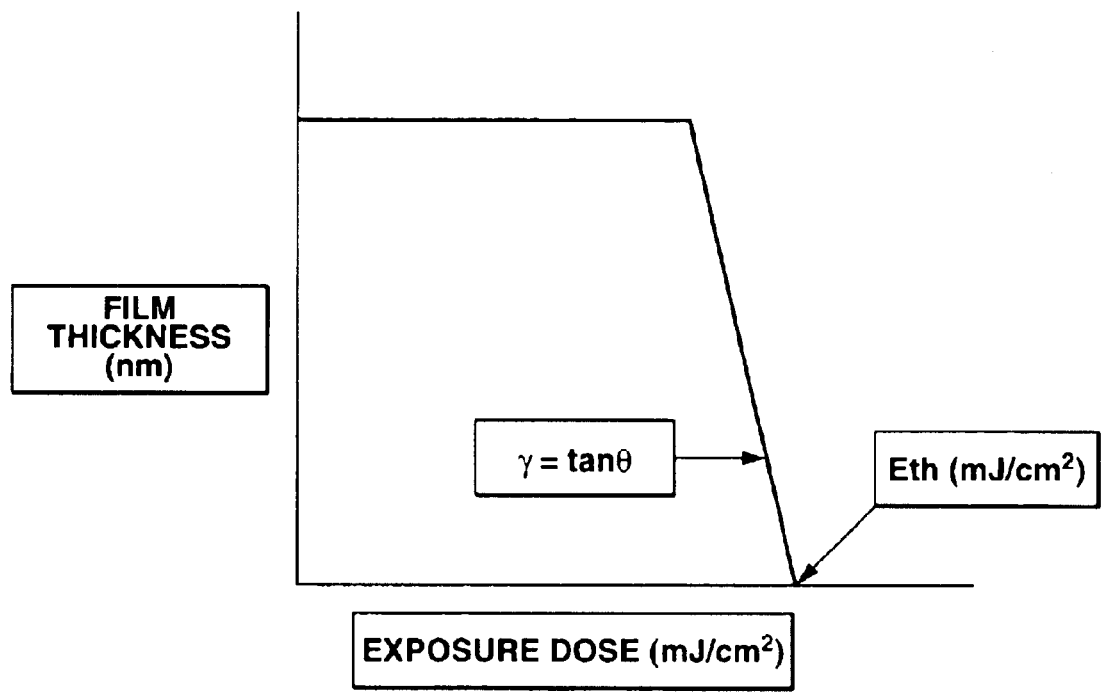
FIG. 1 is an illustrative diagram of a sensitivity curve.

The resist composition of the invention is adapted for exposure to high-energy radiation having a wavelength below 180 nm, and advantageously used as a chemically amplified resist composition, especially a chemically amplified positive working resist composition. The composition is defined as comprising (A) a base resin in the form of a polymer comprising recurring units having an alicyclic hydrocarbon backbone to which a carboxylate moiety capable of generating carboxylic acid when decomposed under acidic conditions is attached via a spacer, typically alkylene group, having 1 to 20 carbon atoms, preferably 1 to 10 carbon atoms, and more preferably 1 to 8 carbon atoms, (B) a photoacid generator, and (C) an organic solvent.

Base resin

The base resin (A) is typically a polymer of a norbornene derivative, tricyclododecene derivative or tetracyclododecene derivative. More preferably, the base resin (A) is a polymer or high molecular weight compound comprising recurring units of the following formula (1), (2) or (3).

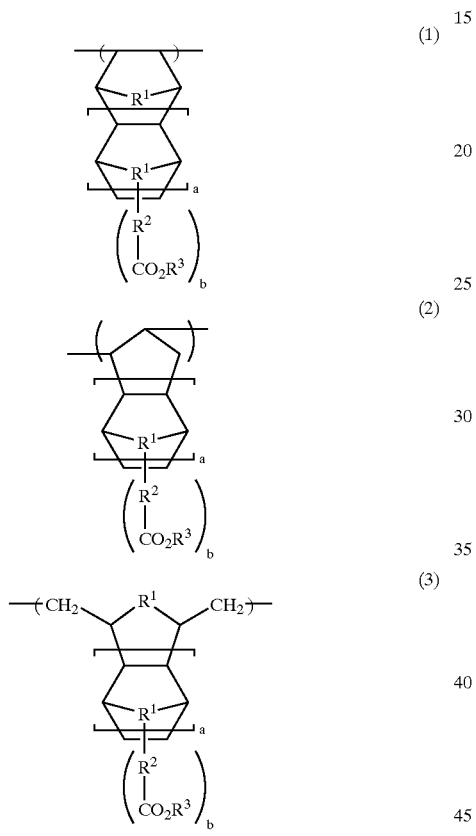

Herein $R^1$ is methylene, oxygen or sulfur, $R^2$ is a straight, branched or cyclic alkylene group of 1 to 20 carbon atoms which may contain a hetero atom such as oxygen, nitrogen or sulfur to form a hydroxy, alkoxy, acetyl or ester group, $R^3$ is an acid labile group, "a" is 0 or 1, and "b" is 1 or 2.

The alkylene groups represented by $R^2$ are those of 1 to 20 carbon atoms, preferably 1 to 10 carbon atoms, and more preferably 1 to 8 carbon atoms. The hydroxy, alkoxy, acetyl or ester group can be introduced into the alkylene group by substituting for at least one of the hydrogen atoms of the alkylene group. The alkoxy group used herein preferably has 1 to 10 carbon atoms, especially 1 to 6 carbon atoms. The ester group may be represented by —$OCOR^8$ or —$OCOR^3$ wherein $R^8$ is an alkyl group of 1 to 4 carbon atoms and $R^3$ is an acid labile group.

The spacer-containing groups represented by —$R^2$—$COOR^3$ include those of the following formulae (5)-1 through (5)-8.

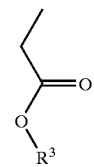

(5)-1

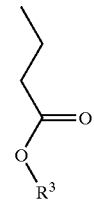

(5)-2

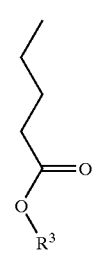

(5)-3

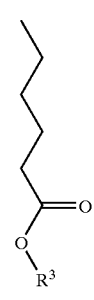

(5)-4

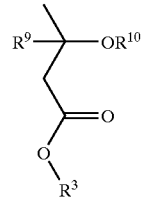

(5)-5

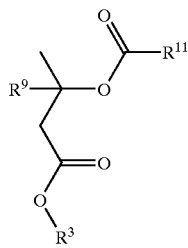

(5)-6

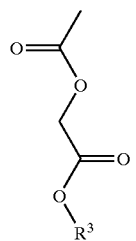

(5)-7

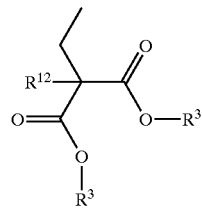
(5)-8

Herein, $R^3$ is an acid labile group, and $R^9$ to $R^{12}$ each are hydrogen or $C_{1-4}$ alkyl.

The acid labile group represented by $R^3$ is selected from a variety of such groups, although fluorine-containing acid labile groups of the following general formula (4) are especially preferred.

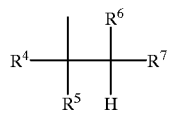
(4)

Herein $R^4$, $R^5$ $R^6$ and $R^7$ each are hydrogen, fluorine, or a straight, branched or cyclic alkyl or fluorinated alkyl group of 1 to 20 carbon atoms, and at least one of $R^4$, $R^5$, $R^6$ and $R^7$ contains fluorine.

The alkyl groups represented by $R^4$, $R^5$, $R^6$ and $R^7$ are those of 1 to 20 carbon atoms, preferably 1 to 12 carbon atoms, and more preferably 1 to 10 carbon atoms, including methyl, ethyl, propyl, isopropyl, butyl, isobutyl, tert-butyl, pentyl, cyclopentyl, hexyl, cyclohexyl, 2-ethylhexyl, n-octyl, decyl and dodecyl. The fluorinated alkyl groups correspond to the foregoing alkyl groups in which some or all of the hydrogen atoms are replaced by fluorine atoms and include, for example, trifluoromethyl, 2,2,2-trifluoroethyl, 3,3,3-trifluoropropyl, and 1,1,2,2,3,3,3-heptafluoropropyl.

Illustratively, the acid labile groups of formula (4) include those of the following formulae (4)-1 through (4)-7.

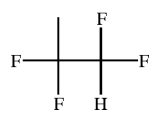
(4)-1

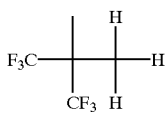
(4)-2

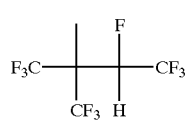
(4)-3

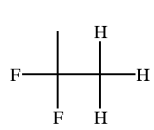
(4)-4

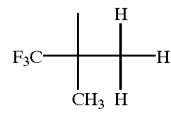
(4)-5

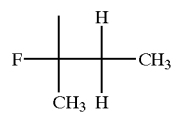
(4)-6

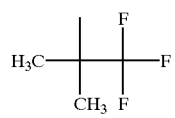
(4)-7

In another preferred embodiment, the acid labile group represented by $R^3$ is selected from among the groups of the following formulas (6) and (7), tertiary alkyl groups with 4 to 40 carbon atoms of the following formula (8), trialkylsilyl groups whose alkyl groups each have 1 to 6 carbon atoms, and oxoalkyl groups of 4 to 20 carbon atoms.

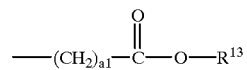
(6)

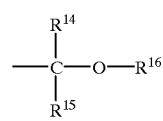
(7)

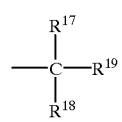
(8)

In formula (6), $R^{13}$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (8). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxolan-4-yl. Letter "a1" is an integer of 0 to 6.

In formula (7), $R^{14}$ and $R^{15}$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{16}$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

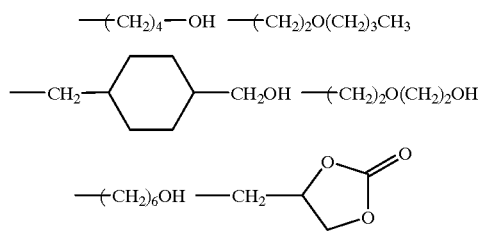

A pair of $R^{14}$ and $R^{15}$, a pair of $R^{14}$ and $R^{16}$, or a pair of $R^{15}$ and $R^{16}$, taken together, may form a ring. Each of $R^{14}$, $R^{15}$ and $R^{16}$ is a straight or branched alkylene group of 1 to 18 carbon atoms, preferably 1 to 10 carbon atoms, when they form a ring.

Illustrative examples of the acid labile groups of formula (6) include tert-butoxycarbonyl, tert-butoxycarbonylmethyl, tert-amyloxycarbonyl, tert-amyloxycarbonyl-methyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyl-oxycarbonylmethyl, 1-ethoxyethoxycarbonylmethyl, 2-tetrahydropyranyloxycarbonylmethyl, and 2-tetrahydrofuranyloxycarbonylmethyl.

Of the acid labile groups of formula (7), illustrative examples of the straight or branched groups are given below.

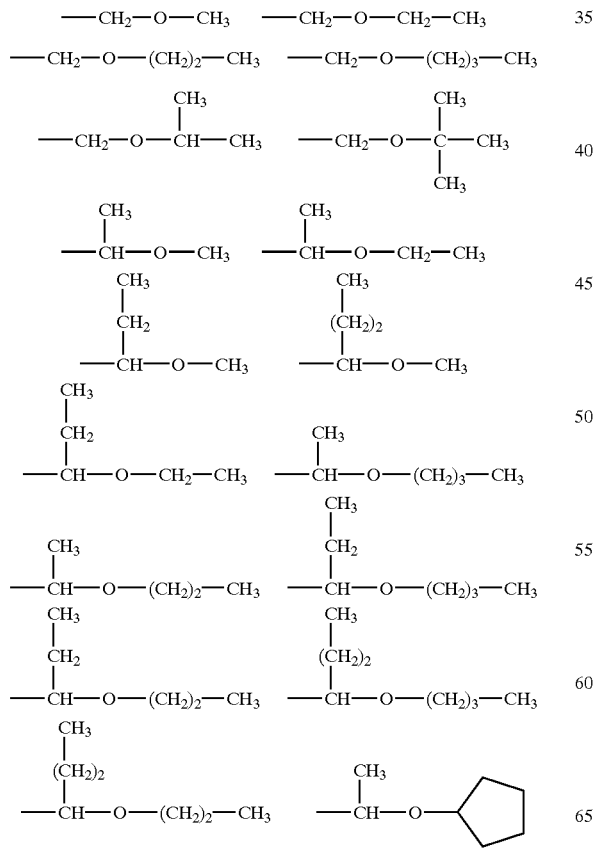

Of the acid labile groups of formula (7), illustrative examples of the cyclic groups include tetrahydrofuran-2-yl, 2-methyltetrahydrofuran-2-yl, tetrahydropyran-2-yl and 2-methyltetrahydropyran-2-yl. Preferred among the groups of formula (7) are ethoxyethyl, butoxyethyl and ethoxypropyl.

In formula (8), $R^{17}$, $R^{18}$ and $R^{19}$ are independently monovalent hydrocarbon groups, for example, straight, branched or cyclic alkyl groups of 1 to 20 carbon atoms, which may contain a hetero atom such as oxygen, sulfur, nitrogen or fluorine. A pair of $R^{17}$ and $R^{18}$, a pair of $R^{17}$ and $R^{19}$, or a pair of $R^{18}$ and $R^{19}$, taken together, may form a ring.

Examples of the tertiary alkyl group represented by formula (8) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (8-1) through (8–16).

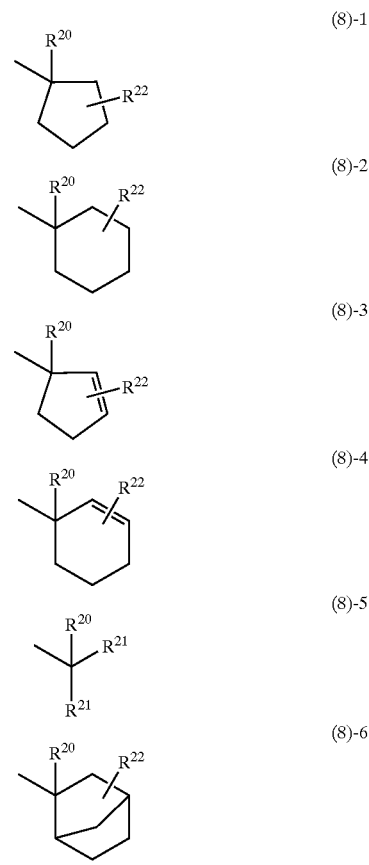

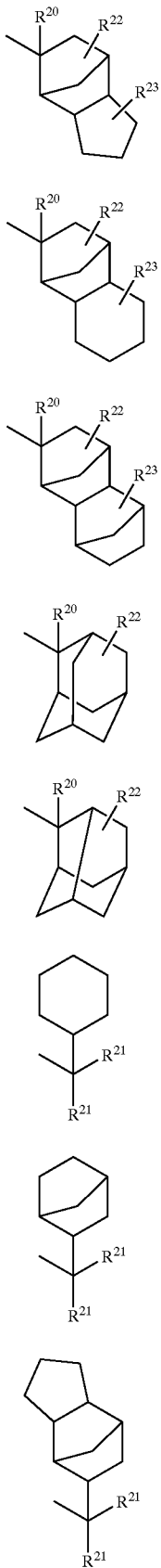

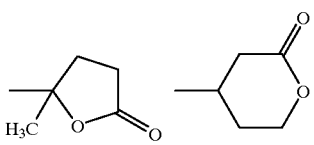

Herein, $R^{20}$ and $R^{21}$ each are a straight, branched or cyclic alkyl group of 1 to 6 carbon atoms, for example, methyl, ethyl, propyl, isopropyl, n-butyl, sec-butyl, n-pentyl, n-hexyl, cyclopropyl or cyclopropylmethyl. $R^{22}$ is hydrogen, a monovalent $C_{1-6}$ hydrocarbon group which may contain a hetero atom or a monovalent $C_{1-6}$ hydrocarbon group which may be separated by a hetero atom, with the hydrocarbon being typically alkyl. The hetero atom is an oxygen, sulfur or nitrogen atom, which is contained or intervenes in the form of —OH, —OR, —O—, —S—, —S(=O)—, —NH$_2$, —NHR, —NR$_2$, —NH—, or —NR— wherein R is an alkyl group of 1 to 20 carbon atoms, and especially 1 to 16 carbon atoms.

$R^{23}$ is hydrogen or an alkyl, hydroxyalkyl, alkoxy or alkoxyalkyl group of 1 to 20 carbon atoms, especially 1 to 16 carbon atoms, which may be straight, branched or cyclic. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Of the acid labile group represented by $R^3$, the trialkylsilyl groups whose alkyl groups each have 1 to 6 carbon atoms include trimethylsilyl, triethylsilyl, and tert-butyldimethylsilyl.

The oxoalkyl groups of 4 to 20 carbon atoms include 3-oxocyclohexyl and groups of the following formulae.

Alternatively, the acid labile group represented by $R^3$ may be a crosslinking group of the following general formula (9a) or (9b). In this embodiment, the polymer is crosslinked between molecules or within a molecule with the crosslinking groups.

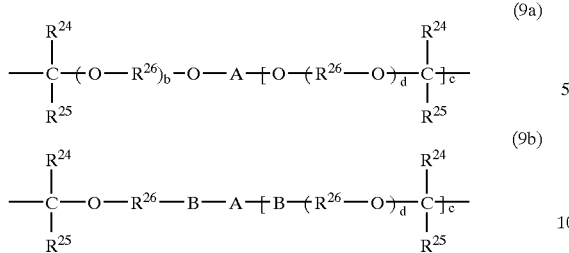

(9a)

(9b)

Herein, $R^{24}$ and $R^{25}$ each are hydrogen or a straight, branched or cyclic alkyl group of 1 to 8 carbon atoms, or $R^{24}$ and $R^{25}$, taken together, may form a ring, with the proviso that each of $R^{24}$ and $R^{25}$ is a straight or branched alkylene group of 1 to 8 carbon atoms when they form a ring. $R^{26}$ is a straight, branched or cyclic alkylene group of 1 to 10 carbon atoms. Letter b and d each are 0 or an integer of 1 to 10, preferably 0 or an integer of 1 to 5, and c is an integer of 1 to 7. A is a (c+1)-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, carbonyl group or fluorine atom. B is —CO—O—, —NHCO—O— or —NHCONH—.

Preferably, A is a di- to tetra-valent straight, branched or cyclic alkylene, alkyltriyl or alkyltetrayl group of 1 to 20 carbon atoms or arylene group of 6 to 30 carbon atoms, which may have an intervening hetero atom and in which the hydrogen atom attached to a carbon atom may be partially replaced by a hydroxyl group, carboxyl group, acyl group or halogen atom. Letter c is preferably an integer of 1 to 3.

As understood from the value of c in formula (9a) or (9b), the crosslinking group is not limited to a divalent one and trivalent to octavalent groups are acceptable. For example, the divalent crosslinking group is exemplified by groups of the following formulas (9a') and (9b'), and the trivalent crosslinking group is exemplified by groups of the following formulas (9a") and (9b").

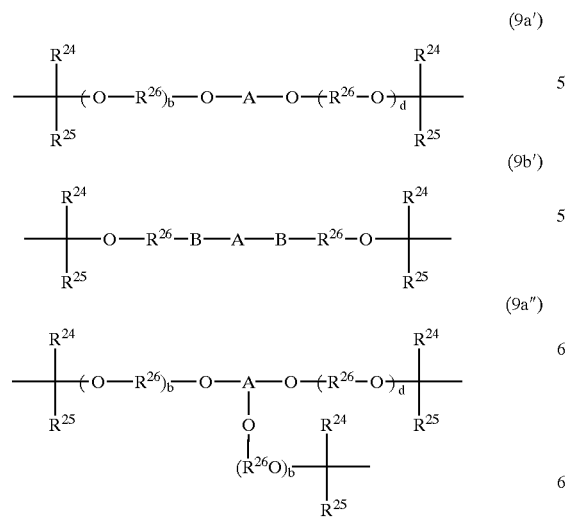

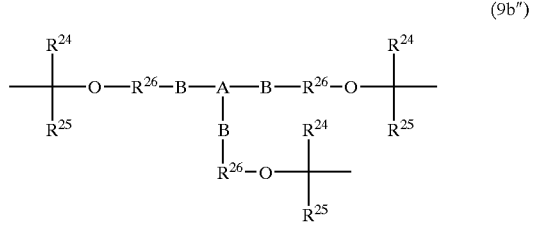

"A" in the crosslinking group is described in more detail. The (c+1)-valent organic groups represented by A include hydrocarbon groups, for example, substituted or unsubstituted alkylene groups having 1 to 50 carbon atoms, especially 1 to 40 carbon atoms, substituted or unsubstituted arylene groups having 6 to 50 carbon atoms, more preferably 6 to 40 carbon atoms, a combination of an alkylene group and an arylene group, and covalent groups obtained by eliminating one hydrogen atom attached to a carbon atom from the foregoing groups wherein c' is an integer of 3 to 8; and (c+1)-valent heterocyclic groups, and a combination of such a heterocyclic group with any one of the foregoing hydrocarbon groups. In the alkylene and arylene groups, a hetero atom such as O, NH, N(CH$_3$), S and SO$_2$ may intervene and where substituted, the substituent is a hydroxyl, carboxyl, acyl group or fluorine.

Illustrative examples of A are given below.

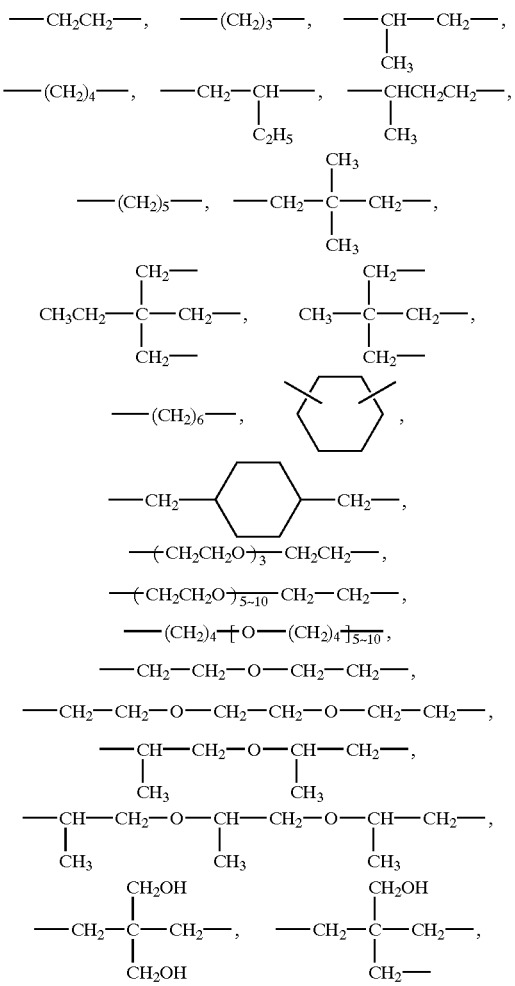

-continued
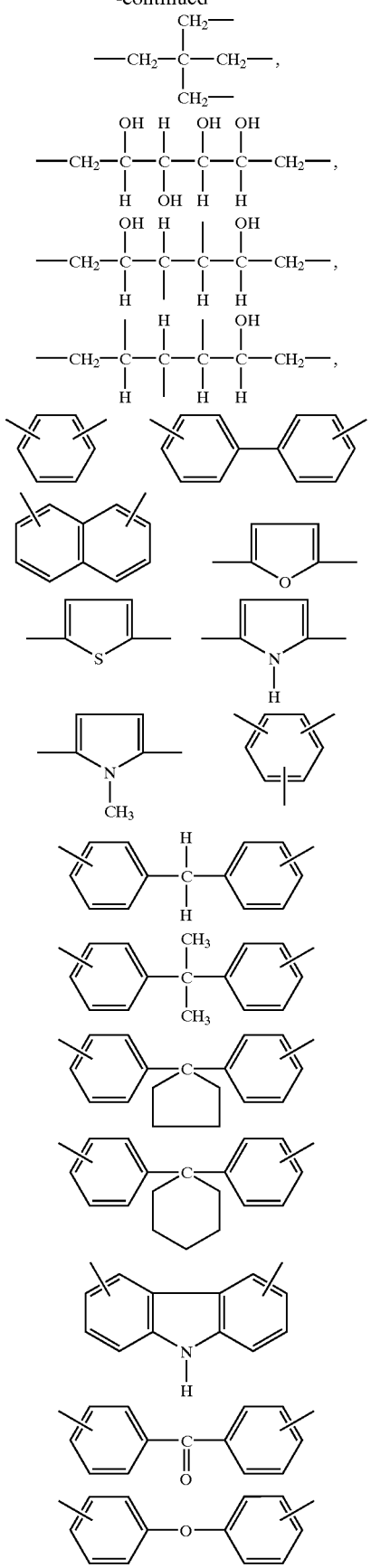
-continued
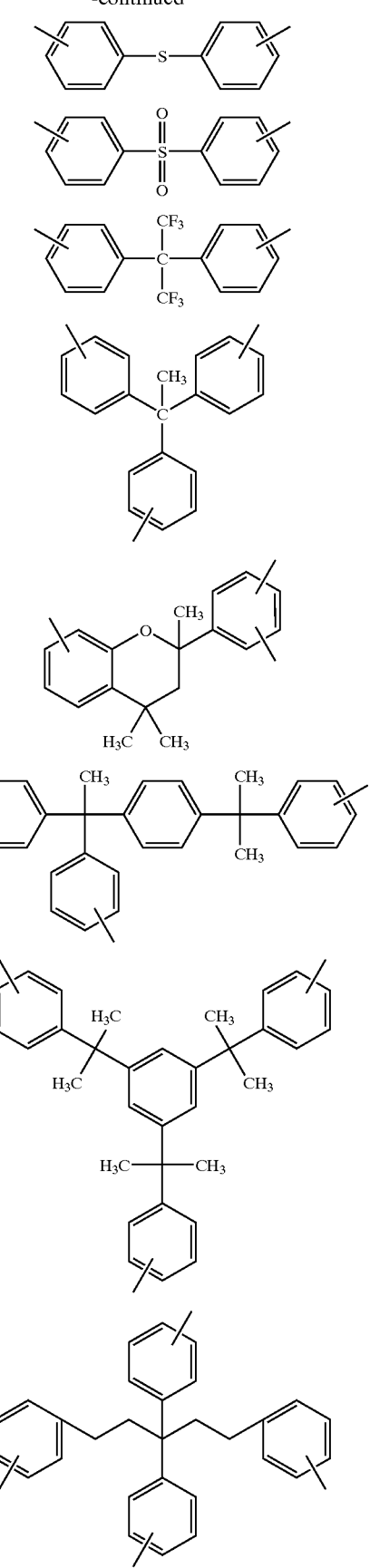

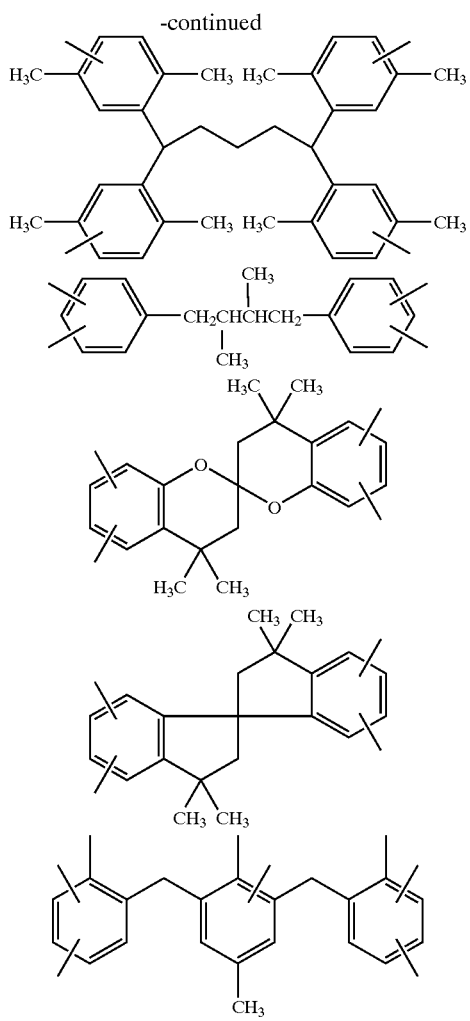

Preferably, in formula (9a), $R^{24}$ is methyl, $R^{25}$ is hydrogen, b is 0, c is 1, and A is ethylene, 1,4-butylene or 1,4-cyclohexylene.

The polymer which is crosslinked between molecules and/or within a molecule with crosslinking groups having C—O—C linkages can be synthesized by reacting a corresponding uncrosslinked polymer with an alkenyl ether in the presence of an acid catalyst in a conventional way.

Where decomposition of other acid labile groups takes place under the acid catalyzed condition, the alkenyl ether is previously reacted with hydrochloric acid or the like to form a halogenated alkyl ether, which is reacted with the uncrosslinked polymer under basic conditions in a conventional way, obtaining the end product.

Illustrative, non-limiting examples of the alkenyl ether include ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, neopentyl glycol divinyl ether, trimethylolpropane trivinyl ether, trimethylolethane trivinyl ether, hexanediol divinyl ether, 1,4-cyclohexane-diol divinyl ether, 1,4-divinyloxymethyl cyclohexane, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, and compounds of the formulas (I-1) to (I-31) given below.

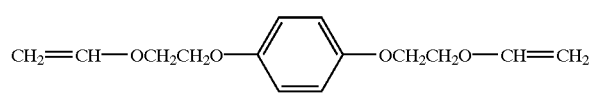

(I-1)

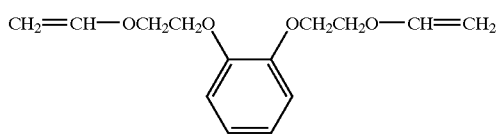

(I-2)

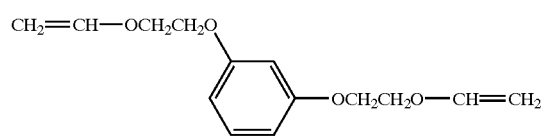

(I-3)

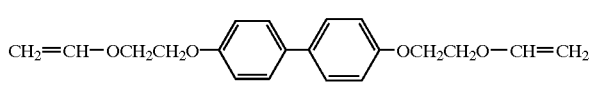

(I-4)

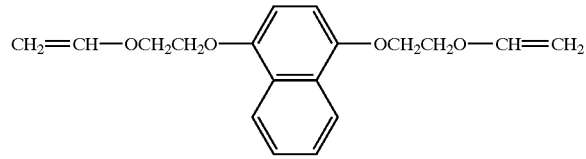

(I-5)

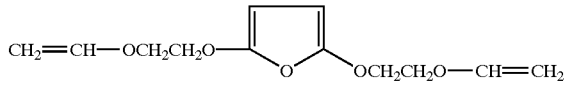

(I-6)

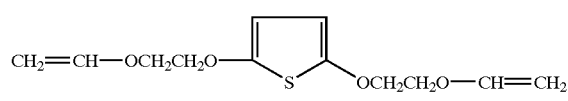

(I-7)

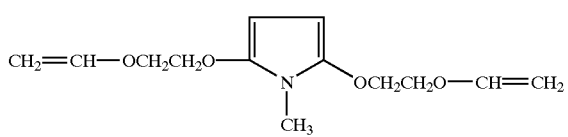

(I-8)

-continued
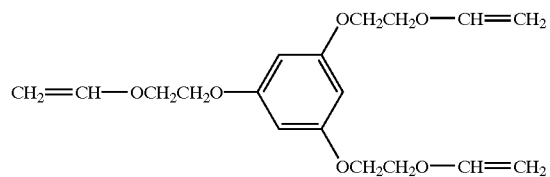
(I-9)
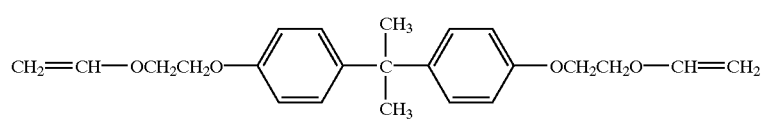
(I-10)
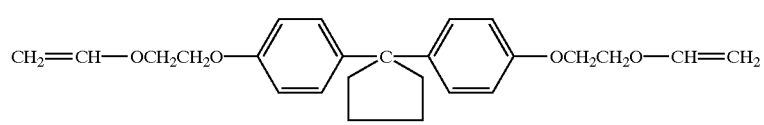
(I-11)
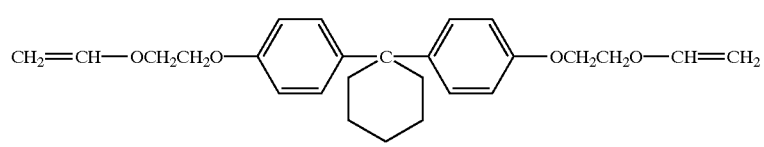
(I-12)
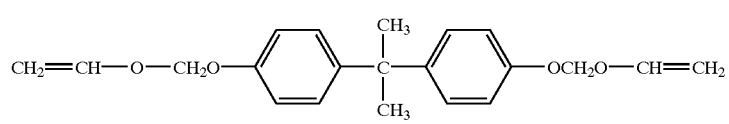
(I-13)
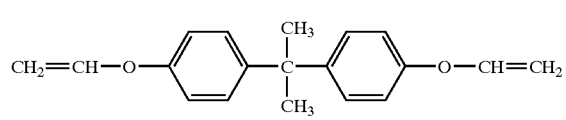
(I-14)
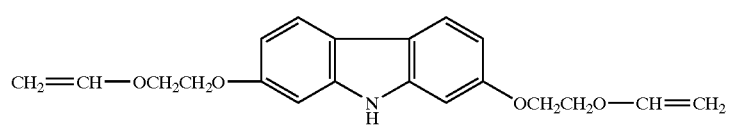
(I-15)
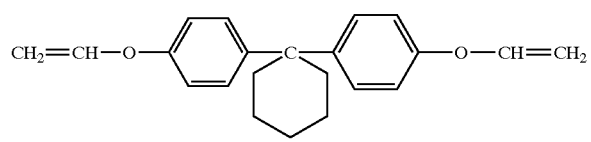
(I-16)
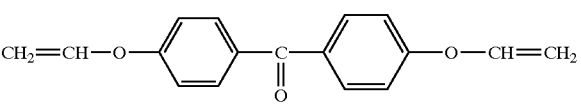
(I-17)
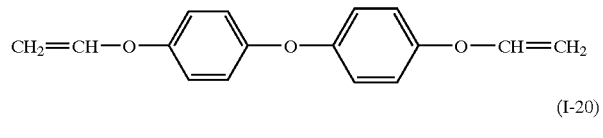
(I-18)
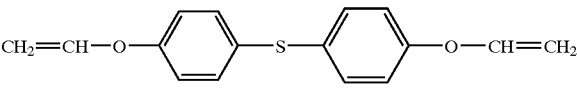
(I-19)
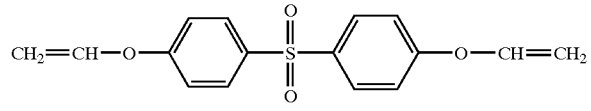
(I-20)
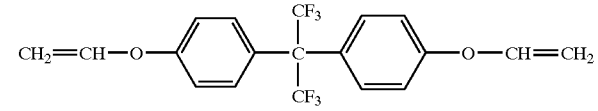
(I-21)

-continued
(I-22)
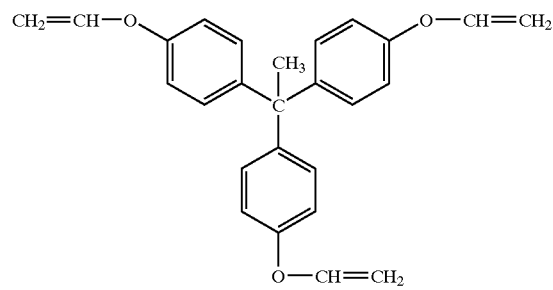
(I-23)
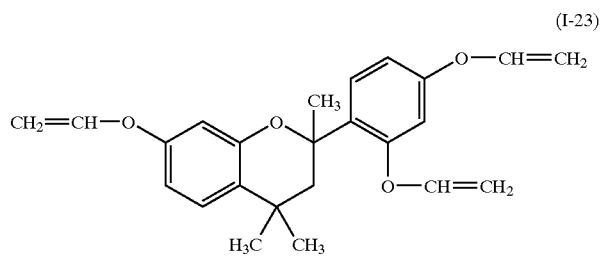
(I-24)
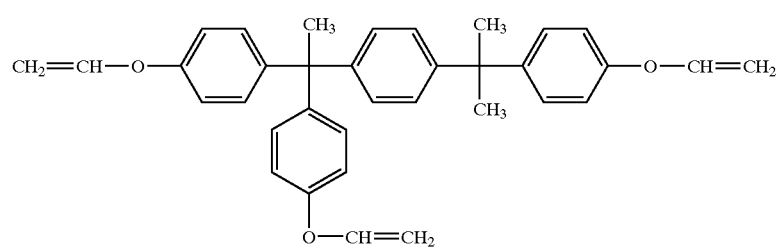
(I-25)
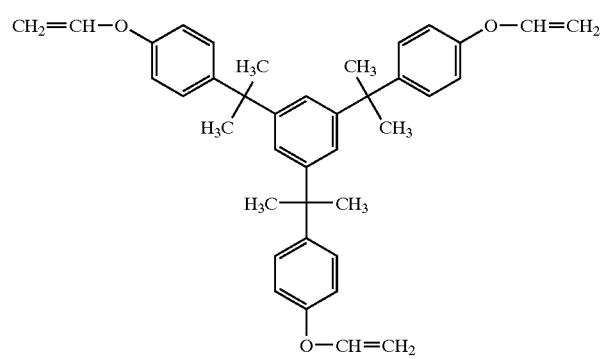
(I-26)
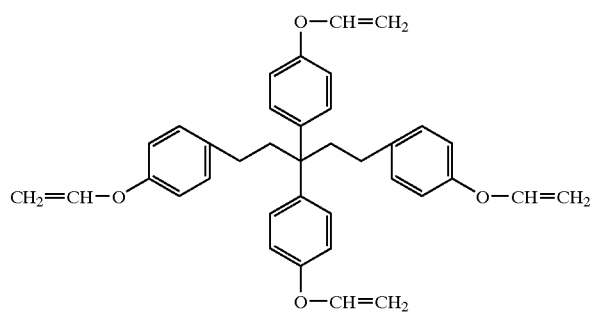
(I-27)
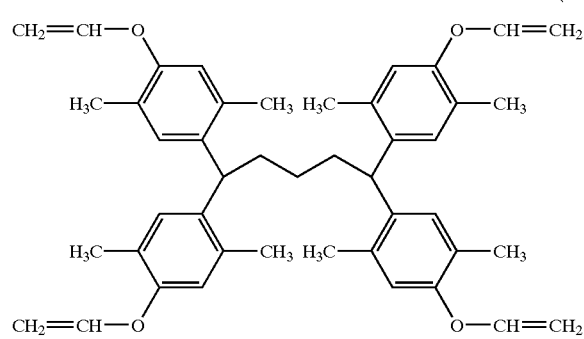
(I-28)
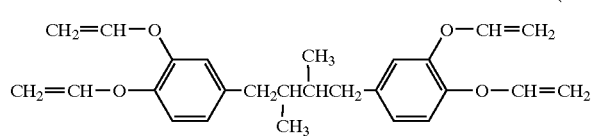
(I-29)
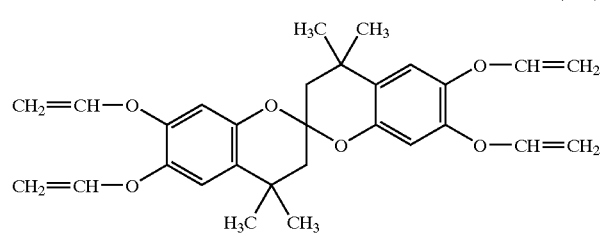
(I-30)
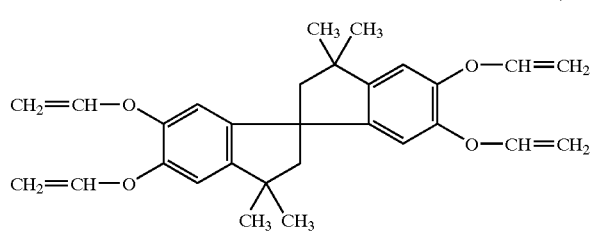

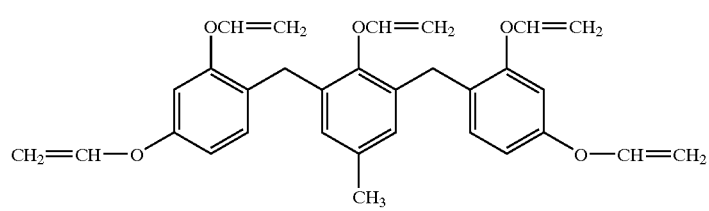

Also included are diethylene vinyl ether terephthalate, diethylene vinyl ether phthalate, diethylene vinyl ether isophthalate, dipropylene vinyl ether phthalate, dipropylene vinyl ether terephthalate, dipropylene vinyl ether isophthalate, diethylene vinyl ether maleate, diethylene vinyl ether fumarate, and diethylene vinyl ether itaconate, and compounds of the formulas (II-1) to (II-11) given below. The alkenyl ether is not limited to the exemplified compounds.

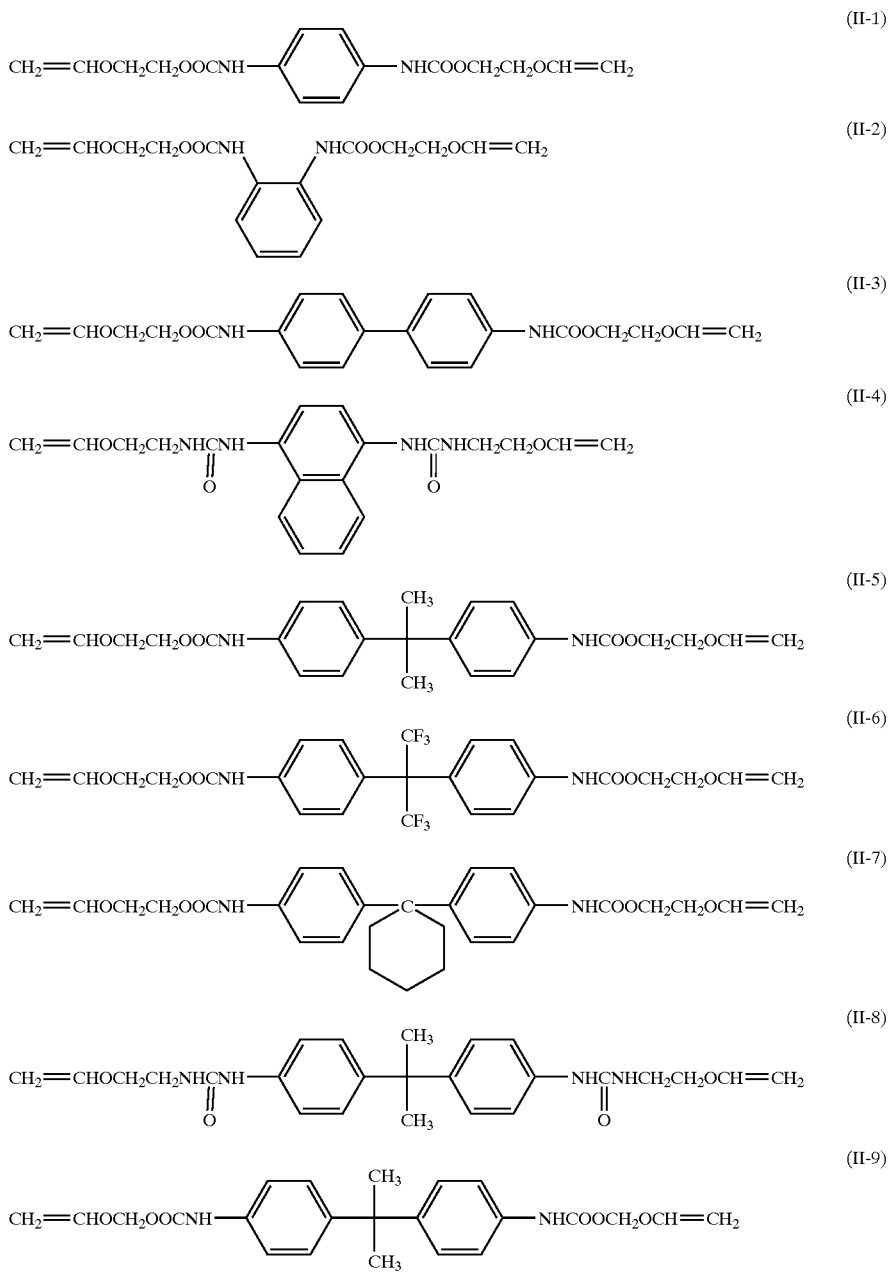

(II-10)

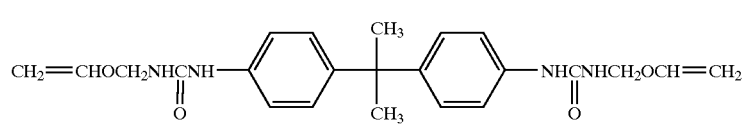

(II-11)

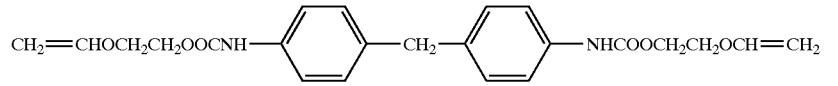

The base resin used in the patterning process of the invention is comprised essentially of recurring units of formula (1), (2) or (3) containing acid labile groups while recurring units of one or more types containing adhesive groups may be copolymerized therewith.

Monomers for improving adhesion are those containing hydrophilic substituent groups such as phenol, acid anhydride, ester (or lactone), carbonate, alcohol, carboxylic acid, carboxylic amide, sulfonic amide and ketone. Illustrative are recurring units of the following formulae (10)-1 through (10)-52.

(10)-1
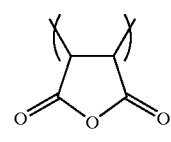

(10)-2
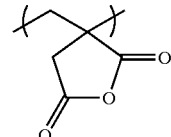

(10)-3
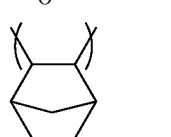

(10)-4
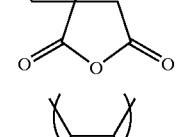

(10)-5
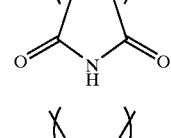

(10)-6
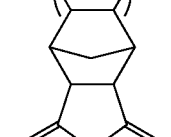

(10)-7
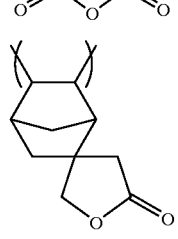

(10)-8
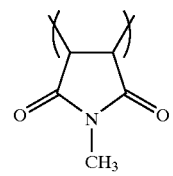

(10)-9
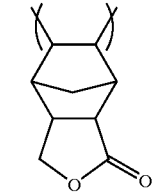

(10)-10
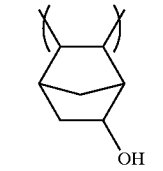

(10)-11
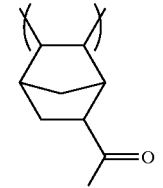

(10)-12
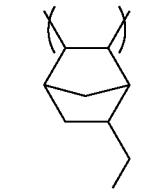

(10)-13
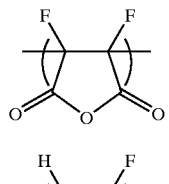

(10)-14
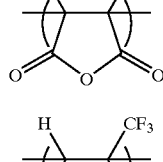

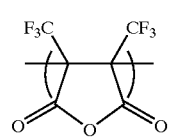 (10)-15
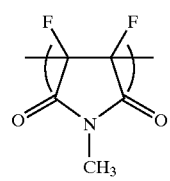 (10)-16
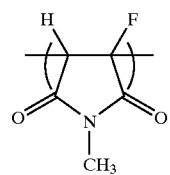 (10)-17
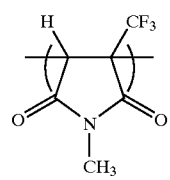 (10)-18
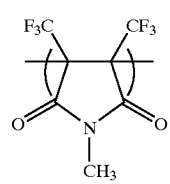 (10)-19
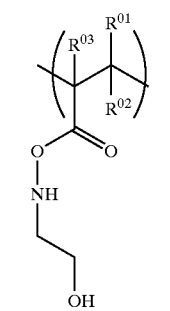 (10)-20
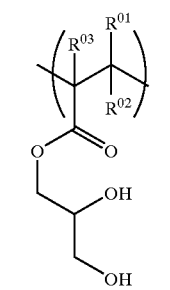 (10)-21
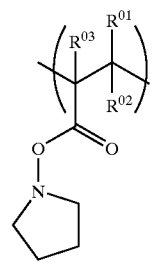 (10)-22
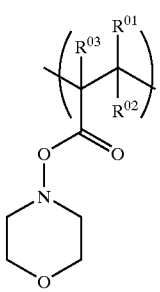 (10)-23
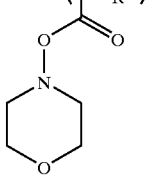 (10)-24
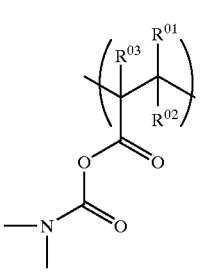 (10)-25
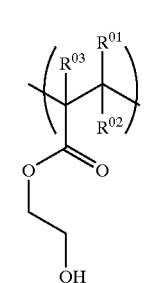 (10)-26

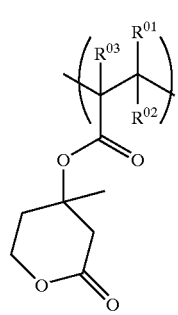 (10)-27
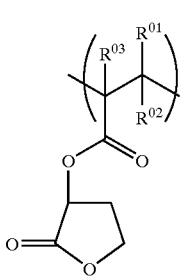 (10)-28
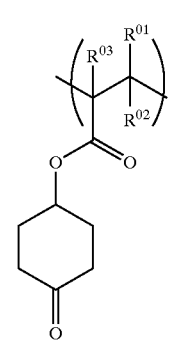 (10)-29
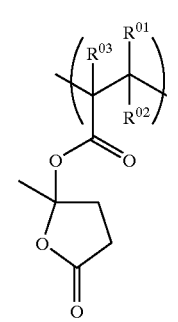 (10)-30
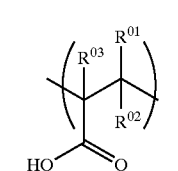 (10)-31
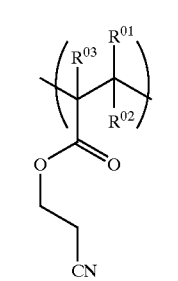 (10)-32
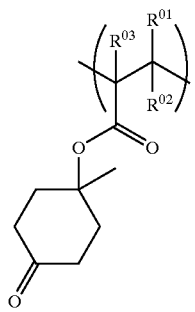 (10)-33
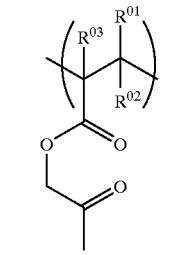 (10)-34
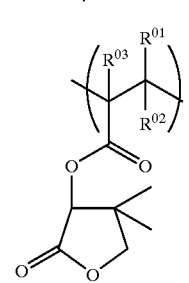 (10)-35
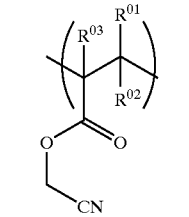 (10)-36
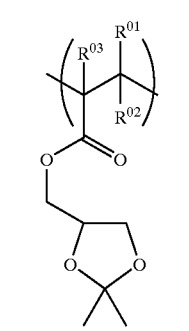 (10)-37
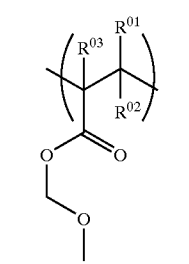 (10)-38

(10)-39
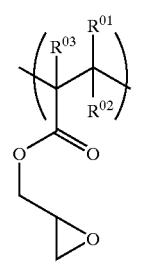
(10)-40
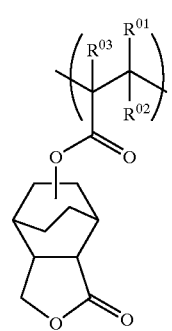
(10)-41
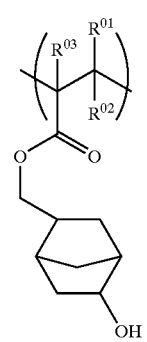
(10)-42
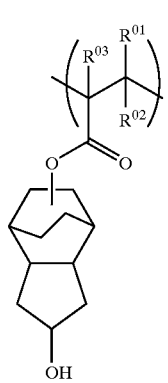
(10)-43
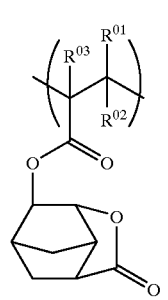
(10)-44
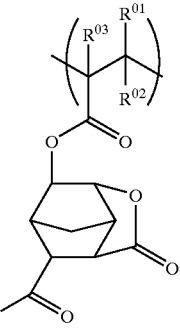
(10)-45
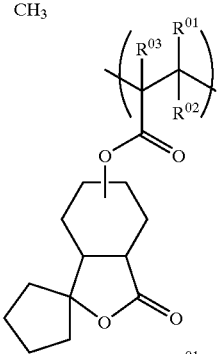
(10)-46
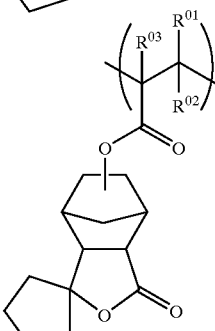
(10)-47
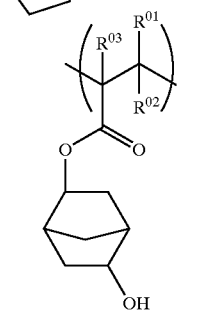
(10)-48
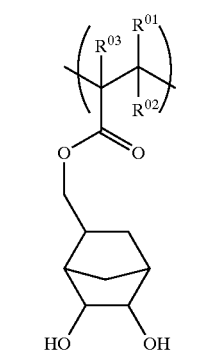

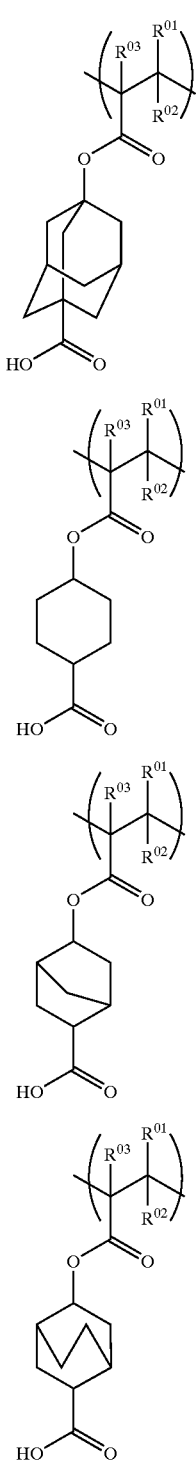

(10)-49

(10)-50

(10)-51

(10)-52

In the above formulae, $R^{01}$, $R^{02}$ and $R^{03}$ each are hydrogen, fluorine, or a straight, branched or cyclic alkyl or fluorinated alkyl group of 1 to 20 carbon atoms.

In addition to the recurring units of formula (1), (2) or (3), the inventive polymer may have copolymerized therewith recurring units containing acid labile groups. Such additional recurring units are those of the formula (11)-1 to (11)-3 shown below, as originating from methacrylic acid derivatives, acrylic acid derivatives, malonic acid derivatives, itaconic acid derivatives, or phenol derivatives.

(11)-1

(11)-2

(11)-3

Herein, $R^{01}$, R $R^{03}$ and $R^3$ are as defined above, and c, d and e each are a number in the range: $0 \leq c < 5$, $0 \leq d < 5$, $0 < c+d < 5$, and $0 < e < 5$.

The polymer of the invention is generally synthesized by mixing monomers to afford the above-described units with a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for polymerization the polymer of the invention are radical polymerization of triggering polymerization with radicals of 2,2'-azobisisobutyronitrile (AIBN) or the like, ion (anion) polymerization using catalysts such as alkyl lithium, ring-opening polymerization using metal catalysts, and cationic polymerization. The polymerization reaction can be effected in a conventional way.

Preferably, the polymer contains 20 to 100 mol %, more preferably 30 to 100 mol %, even more preferably 40 to 100 mol % of the units of formulae (1) to (3); 0 to 70 mol %, more preferably 0 to 60 mol %, even more preferably 0 to 50 mol % of the adhesion-improving monomer, especially units of formulae (10)-1 to (10)-52; and 0 to 10 mol %, more preferably 0 to 5 mol % of the units of formulae (11)-1 to (11)-3, Desirably the polymer has a weight average molecular weight of about 2,000 to about 1,000,000, and especially about 3,000 to about 100,000.

Resist Composition

The resist compositions of the invention are advantageously used in the chemical amplification form, and especially chemical amplification positive working form.

Specifically, the resist composition is defined as comprising (A) a base resin in the form of the above-defined polymer, (B) a photoacid generator, and (C) an organic solvent as essential components. In the resist composition, there may be further formulated one or more of (D) a basic compound, (E) a dissolution inhibitor, and (F) a dissolution improver.

Component (B)

Suitable examples of the photoacid generator (B) include onium salts of general formula (12) below, diazomethane derivatives of formula (13), glyoxime derivatives of formula (14), β-ketosulfone derivatives, disulfone derivatives, nitrobenzylsulfonate derivatives, sulfonic acid ester derivatives, and imidoyl sulfonate derivatives.

$$(R^{30})_b M^+ K^- \tag{12}$$

In the formula, $R^{30}$ is a straight, branched or cyclic alkyl of 1 to 12 carbon atoms, an aryl of 6 to 12 carbon atoms, or an aralkyl of 7 to 12 carbon atoms; M+ is iodonium or sulfonium; K⁻ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxy-phenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butyl-phenyl, and dimethylphenyl. Exemplary aralkyl groups include benzyl and phenethyl. Examples of the non-nucleophilic counter-ion represented by K⁻ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

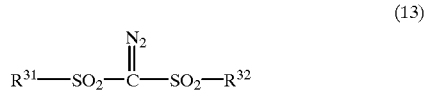

(13)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluoro-butyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

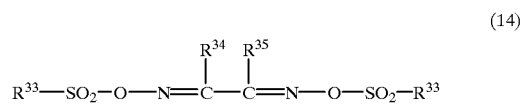

(14)

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups as mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:

onium salts such as diphenyliodonium trifluoromethanesulfonate, (p-tert-butoxyphenyl)phenyliodonium trifluoromethanesulfonate, diphenyliodonium p-toluene-sulfonate, (p-tert-butoxyphenyl) phenyliodonium p-toluene-sulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris (p-tert-butoxyphenyl)sulfonium p-toluenesulfonate, triphenylsulfonium nonafluorobutane-sulfonate, triphenylsulfonium butanesulfonate, trimethyl-sulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenyl-sulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)-diazomethane, bis(p-toluenesulfonyl)diazomethane, bis(xylenesulfonyl)diazomethane, bis(cyclohexylsulfonyl)-diazomethane, bis(cyclopentylsulfonyl)diazomethane, bis(n-butylsulfonyl)diazomethane, bis(isobutylsulfonyl)-diazomethane, bis(sec-butylsulfonyl)diazomethane, bis (n-propylsulfonyl)diazomethane, bis (isopropylsulfonyl)-diazomethane, bis(tert-butylsulfonyl)diazomethane, bis(n-amylsulfonyl) diazomethane, bis(isoamylsulfonyl)diazomethane, bis (sec-amylsulfonyl)diazomethane, bis(tert-amylsulfonyl)-diazomethane, 1-cyclohexylsulfonyl-1-(tert-butylsulfonyl)-diazomethane, 1-cyclohexylsulfonyl-1-(tert-amylsulfonyl)-diazomethane, and 1-tert-amylsulfonyl-1-(tert-butylsulfonyl)diazomethane;

glyoxime derivatives such as bis-O-(p-toluene-sulfonyl)-α-dimethylglyoxime, bis-O-(p-toluenesulfonyl)-α-diphenylglyoxime, bis-O-(p-toluenesulfonyl)-α-dicyclohexyl-glyoxime, bis-O-(p-toluenesulfonyl)-2,3- pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butane-sulfonyl)-2,3-pentanedioneglyoxime, bis-O-(n-butane-sulfonyl)-2-methyl-3,4-pentanedioneglyoxime, bis-O-(methanesulfonyl)-α-dimethylglyoxime, bis-O-(trifluoro-methanesulfonyl)-α-dimethylglyoxime, bis-O-(1,1,1-trifluoro-ethanesulfonyl)-α-dimethylglyoxime, bis-O-(tert-butanesulfonyl)-α-dimethylglyoxime, bis-O-(perfluoro-octanesulfonyl)-α-dimethylglyoxime, bis-O-(cyclohexane-sulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

β-ketosulfone derivatives such as 2-cyclohexyl-carbonyl-2-(p-toluenesulfonyl)propane and 2-isopropyl-carbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoro-methanesulfonyloxy)benzene, and 1,2,3-tris(p-toluene-sulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)-diazomethane, bis(p-toluenesulfonyl)diazomethane, bis(cyclohexylsulfonyl)diazomethane, bis(n-butylsulfonyl)-diazomethane, bis(isobutylsulfonyl)diazomethane, bis(sec-butylsulfonyl)diazomethane, bis(n-propylsulfonyl)-diazomethane, bis(isopropylsulfonl)diazomethane, and bis(tert-butylsulfonyl)diazomethane; and glyoxime derivatives such as bis-O-(p-toluenesulfonyl)-α-dimethyl-glyoxime and bis-O-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight, and especially about 0.5 to 8 parts by weight, per 100 parts by weight of all the base resins. At less than 0.2 part, the amount of acid generated during exposure would be too small and the sensitivity and resolution be poor, whereas the addition of more than 15 parts would lower the transmittance of the resist and result in a poor resolution.

Component (C)

The organic solvent used as component (C) in the invention may be any organic solvent in which the photoacid generator, base resin, dissolution inhibitor, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

Also fluorinated organic solvents may be used for increasing the solubility of fluorinated polymers. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoro-acetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluoro-butyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluoro-nonanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol-1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluoro-butyltetrahydrofuran, perfluoro(butyltetrahydrofuran), perfluorodecalin, perfluoro(1,2-dimethylcyclohexane), perfluoro(1,3- dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione. These solvents may be used alone or in combinations of two or more thereof.

The amount of the organic solvent is determined as appropriate although it is preferably about 300 to 10,000 parts, especially about 400 to 5,000 parts by weight per 100 parts by weight of all the base resins.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred. Examples of suitable primary aliphatic amines include ammonia, methylamine, ethylamine, n-propylamine, isopropyl-amine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylene-diamine, ethylenediamine, and tetraethylenepentamine.

Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyl-tetraethylenepentamine.

Examples of suitable mixed amines include dimethylethylamine, methylethylpropylamine, benzylamine, phenethyl-amine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethyl-ethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)-isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (15) and (16) may also be included.

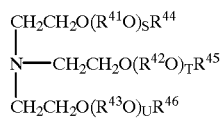

(15)

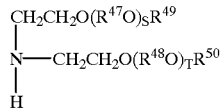

(16)

In the formulas, $R^{41}$, $R^{42}$ $R^{43}$ $R^{47}$ and $R^{48}$ are independently straight, branched or cyclic alkylenes of 1 to 20 carbon atoms; $R^{44}{}_1$ $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$ $R^{44}$ and $R^{46}$ $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have pendant alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (15) and (16) include tris{2-(methoxymethoxy)ethyl}amine, tris{2-(methoxyethoxy)ethyl}amine, tris[2-((2-methoxyethoxy)methoxy}ethyl]amine, tris{2-(2-methoxyethoxy)-ethyl}amine, tris{2-(1-methoxyethoxy)ethyl}amine, tris{2-(1-ethoxyethoxy)ethyl}amine, tris{2-(1-ethoxypropoxy)-ethyl}amine, tris[2-{(2-hydroxyethoxy)ethoxy}ethyl]amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclooctadecane, 1-aza-12-crown-4,1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)-ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of all the base resins. At less than 0.01 part, the desired effects of the basic compound would not be apparent, while the use of more than 2 parts would result in too low a sensitivity.

Component (E)

The dissolution inhibitor (E) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include bisphenol A, bisphenol H, bisphenol S, 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, and thimolphthalein. The acid labile substituents are the same as those exemplified as the acid labile groups in the polymer.

Illustrative, non-limiting, examples of the dissolution inhibitors which are useful herein include
bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy) phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl)-valerate,
tert-butyl 4,4-bis(4'-(2"-tetrahydrofuranyloxy)phenyl)-valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl)-valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane, and
1,1,2-tris(4'-(1'-ethoxypropyloxy)phenyl)ethane.

In the resist composition according to the invention, an appropriate amount of the dissolution inhibitor (E) is up to about 20 parts, and especially up to about 15 parts by weight per 100 parts by weight of the solids in the composition. With more than 20 parts of the dissolution inhibitor, the resist composition becomes less heat resistant because of an increased content of monomer components.

Component (F)

To the resist composition, a dissolution improver may be added as component (F) for the purpose of improving the hydrophobicity of the fluorinated base polymer. Even when the base polymer is made soluble in water or alkali upon exposure to VUV excimer laser, the unexposed areas which are highly hydrophobic are ineffectively wetted with the developer, resulting in the development step becoming inefficient. Then, previously adding a water-soluble compound is an effective means for achieving a high resolution. The dissolution improver used herein may be any of well-known water-soluble compounds, water-soluble resins, alkali-soluble compounds and alkali-soluble resins. Fluorinated such compounds are also useful because they are effective for increasing transparency at VUV wavelength. Specifically, alkylene glycols or oligomers or polymers thereof, carboxylic acid-containing compounds, high acid value resins, hydroxyl-containing compounds, and high hydroxyl number resins are suitable while compounds or resins containing water-soluble substituent groups such as amine, amide, silanol, imide or sulfonic acid are also useful.

In the resist composition of the invention, there may be blended as the base resin one or more polymers other than the polymer described above as component (A). Such additional polymers include polyacrylic acid and derivatives thereof, ternary or quaternary copolymers of norbornene derivative-maleic anhydride alternating copolymers with polyacrylic acid or derivatives thereof, ternary or quaternary copolymers of tetracyclododecene derivative-maleic anhydride alternating copolymers with polyacrylic acid or derivatives thereof, ternary or quaternary copolymers of norbornene derivative-maleimide alternating copolymers with polyacrylic acid or derivatives thereof, ternary or quaternary copolymers of tetracyclododecene derivative-maleimide alternating copolymers with polyacrylic acid or derivatives thereof, and polynorbornene and metathesis ring-opening polymers, alone or in admixture of any.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.01 to 0.5 µm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to radiation having a wavelength below 180 nm such as deep-UV or excimer laser beam in a dose of about 0.5 to 200 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. The resist composition of the invention is best suited to micro-pattern formation with high-energy radiation having a wavelength from 100 nm to 180 nm or from 1 nm to 30 nm, especially such excimer laser beams as $F_2$ excimer laser of 157 nm (which is shorter than ArF excimer laser of 193 nm), $Kr_2$ excimer laser of 146 nm, KrAr excimer laser of 134 nm or $Ar_2$ excimer laser of 121 nm, x-rays, and electron beams. The desired pattern may not be obtainable outside the upper and lower limits of the above range.

The resist composition comprising the polymer of the invention is sensitive to high-energy radiation, and has excellent sensitivity and resolution at a wavelength of less than 180 nm, especially less than 160 nm, and good plasma etching resistance. Because these features of the inventive resist composition enable its use particularly as a resist at the exposure wavelength of a $F_2$ excimer laser, a finely defined pattern having sidewalls perpendicular to the substrate can easily be formed, making the resist ideal as a micropatterning material in VLSI fabrication.

EXAMPLE

Examples of the invention are given below by way of illustration and not by way of limitation. The abbreviations used herein are Mw for weight average molecular weight and Mn for number average molecular weight.

Examples and Comparative Examples (1) Evaluation of Resists

Resist solutions were prepared by thoroughly dissolving Polymers 1 to 10, photoacid generator (PAG1 or PAG2), basic compound, dissolution inhibitor, and dissolution improver in a solvent in the amounts shown in Table 1 and passing the solutions through a 0.1-micron PTFE filter. The solvent used was propylene glycol monomethyl ether acetate (PGMEA) which contained 100 ppm of fluorochemical surfactant FC-430 (Sumitomo 3M Co., Ltd.).

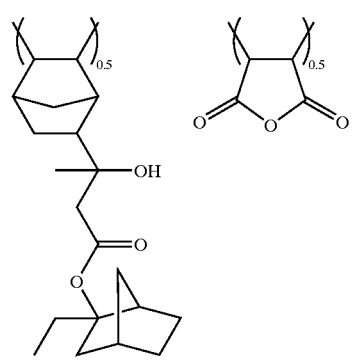
Polymer 1
Mw 12000, Mw/Mn 1.60
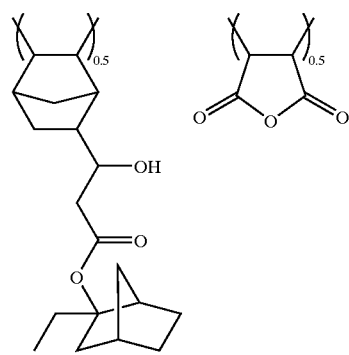
Polymer 2
M 11000, Mw/Mn 1.66
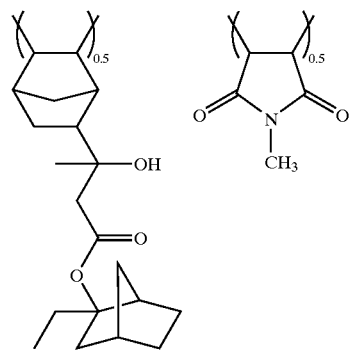
Polymer 3
Mw 10500, Mw/Mn 1.46
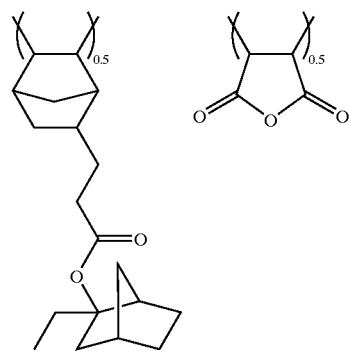
Polymer 4
Mw 10800, Mw/Mn 1.65
-continued
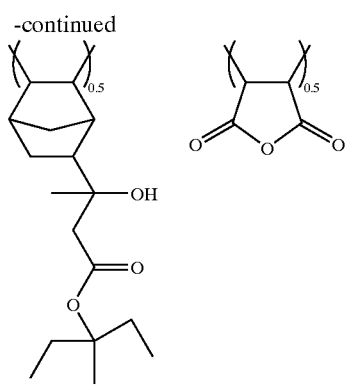
Polymer 5
Mw 13000, Mw/Mn 1.76
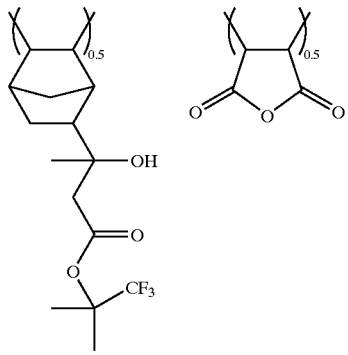
Polymer 6
Mw 6300, Mw/Mn 1.63
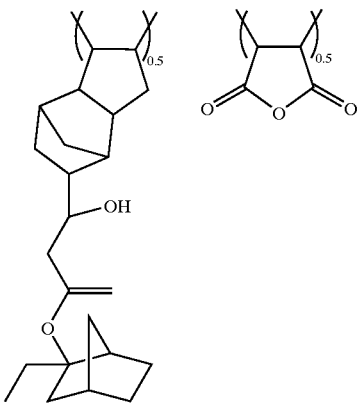
Polymer 7
Mw 7000, Mw/Mn 1.82
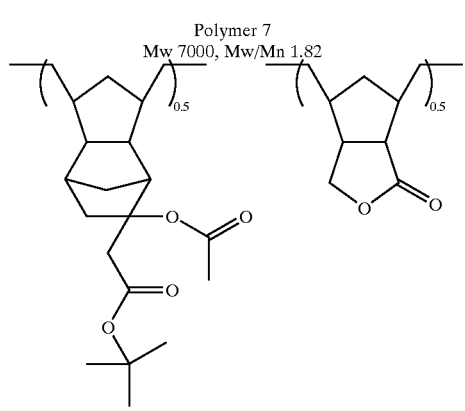
Polymer 8
Mw 14000, Mw/Mn 1.20

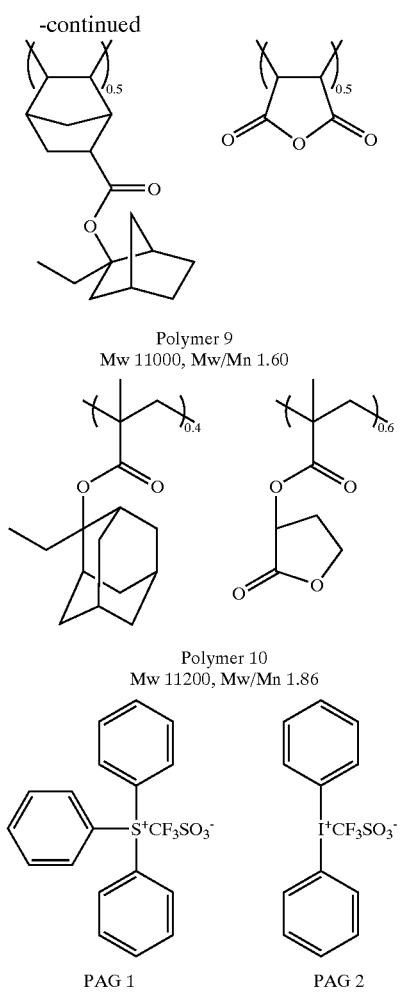

Polymer 9
Mw 11000, Mw/Mn 1.60

Polymer 10
Mw 11200, Mw/Mn 1.86

PAG 1    PAG 2

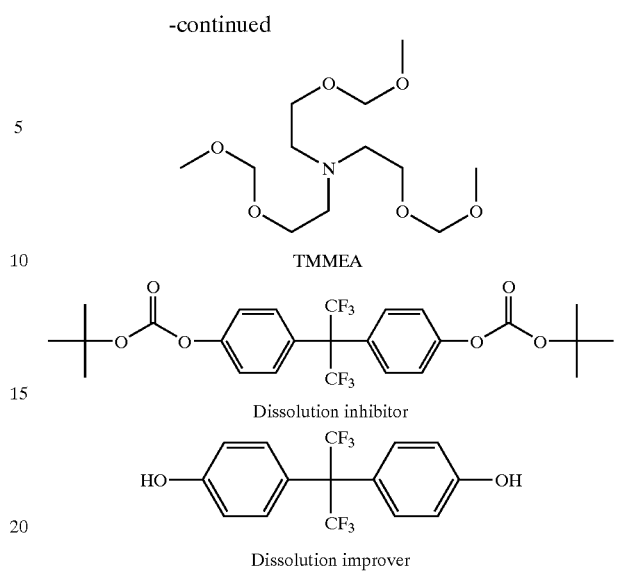

TMMEA

Dissolution inhibitor

Dissolution improver

On silicon wafers, hexamethyldisilazane (HMDS) was vapor primed at 90° C. for 60 seconds. On the primed substrates, the resist solutions were spin coated, then baked on a hot plate at 100° C. for 90 seconds to give resist films having a thickness of 100 nm.

The resist films were exposed in open frame by means of a $F_2$ excimer laser exposure tool VUVES (Litho Tech Japan Corp.). Immediately after exposure, the resist films were baked at 110° C. for 90 seconds and then developed for 60 seconds with a 2.38% aqueous solution of tetramethylammonium hydroxide. From the residual film thickness-to-dose relationship depicted in FIG. 1, the dose (Eth) giving a film thickness 0 was determined, which was regarded sensitivity; and the gradient representative of γ was determined. The results are shown in Table 1.

TABLE 1

|  | Polymer (pbw) | Photoacid generator (pbw) | Basic compound (pbw) | Solvent (pbw) | Additive (pbw) | Eth (mJ/cm$^2$) | γ |
|---|---|---|---|---|---|---|---|
| E1 | Polymer 1 (100) | PAG1 (2) | tributylamine (0.1) | PGMEA (2100) | — | 30 | 16 |
| E2 | Polymer 2 (100) | PAG1 (2) | tributylamine (0.1) | PGMEA (2100) | — | 20 | 11 |
| E3 | Polymer 3 (100) | PAG1 (2) | tributylamine (0.1) | PGMEA (2100) | — | 24 | 13 |
| E4 | Polymer 4 (100) | PAG1 (2) | tributylamine (0.1) | PGMEA (2100) | — | 28 | 15 |
| E5 | Polymer 5 (100) | PAG1 (2) | tributylamine (0.1) | PGMEA (2100) | — | 28 | 12 |
| E6 | Polymer 6 (100) | PAG1 (2) | tributylamine (0.1) | PGMEA (2100) | — | 40 | 10 |
| E7 | Polymer 7 (100) | PAG1 (2) | tributylamine (0.1) | PGMEA (2100) | — | 43 | 12 |
| E8 | Polymer 8 (100) | PAG1 (2) | tributylamine (0.1) | PGMEA (2100) | — | 35 | 8 |
| E9 | Polymer 1 (100) | PAG1 (2) | TMMEA (0.1) | PGMEA (2100) | — | 27 | 17 |
| E10 | Polymer 1 (100) | PAG2 (2) | tributylamine (0.1) | PGMEA (2100) | — | 16 | 15 |
| E11 | Polymer 1 (100) | PAG1 (2) | tributylamine (0.1) | PGMEA (2100) | Dissolution inhibitor (20) | 28 | 18 |

TABLE 1-continued

| | Polymer (pbw) | Photoacid generator (pbw) | Basic compound (pbw) | Solvent (pbw) | Additive (pbw) | Eth (mJ/cm$^2$) | γ |
|---|---|---|---|---|---|---|---|
| E12 | Polymer 6 (100) | PAG1 (2) | tributylamine (0.1) | PGMEA (2100) | Dissolution improver (20) | 35 | 10 |
| CE1 | Polymer 9 (100) | PAG1 (2) | tributylamine (0.1) | PGMEA (2100) | — | 70 | 3 |
| CE2 | Polymer 10 (100) | PAG1 (2) | tributylamine (0.1) | PGMEA (2100) | — | 23 | 17 |

(2) Dry Etching Test

Each of Polymers 1 to 10, 1 g, was thoroughly dissolved in 5 g of propylene glycol monomethyl ether acetate (PGMEA), and passed through a 0.1-micron PTFE filter, obtaining a polymer solution. The polymer solution was coated on a silicon wafer and baked on a hot plate at 100° C. for 90 seconds to form a polymer film of 300 nm thick.

An etching test with $CHF_3/CF_4$ gas was carried out on the polymer film using a dry etching instrument TE-8500P (Tokyo Electron K.K.). The difference in polymer film thickness before and after etching was determined. The surface roughness of the etched surface was measured by an atomic force microscope (AFM). The results are shown in

TABLE 2

| The etching conditions are given below. | |
|---|---|
| chamber pressure | 40.0 Pa |
| RF power | 1300 W |
| gap | 9 mm |
| CHF$_3$ gas flow rate | 30 ml/min |
| CF$_4$ gas flow rate | 30 ml/min |
| Ar gas flow rate | 100 ml/min |
| time | 60 sec |

| Polymer | CHF$_3$/CF$_4$ gas etching rate (nm/min) | Surface roughness Rms after etching (nm) | Remarks |
|---|---|---|---|
| Polymer 1 | 92 | 6.3 | Invention |
| Polymer 2 | 93 | 4.6 | Invention |
| Polymer 3 | 91 | 3.5 | Invention |
| Polymer 4 | 92 | 4.5 | Invention |
| Polymer 5 | 102 | 4.5 | Invention |
| Polymer 6 | 105 | 4.8 | Invention |
| Polymer 7 | 88 | 2.1 | Invention |
| Polymer 8 | 82 | 2.6 | Invention |
| Polymer 9 | 88 | 4.2 | Comparison |
| Polymer 10 | 120 | 20.5 | Comparison |

As is evident from Tables 1 and 2, resist materials using the polymers according to the invention have a high sensitivity and a high contrast (high γ) upon exposure to $F_2$ excimer laser light. Both the difference in resist film thickness before and after etching and the surface roughness after etching are small enough, indicating satisfactory dry etching resistance.

Japanese Patent Application No. 2000-271202 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition adapted for exposure to high-energy radiation having a wavelength below 180 nm, comprising (A) a base resin in the form of a polymer comprising recurring units of the following formula (1), (2) or (3):

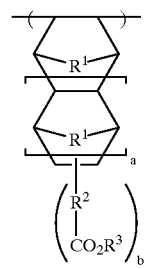

(1)

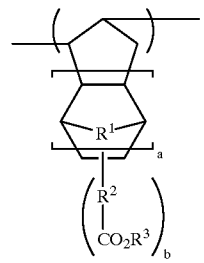

(2)

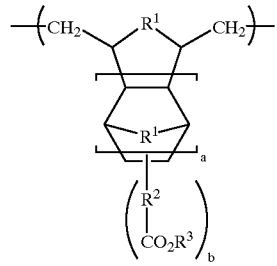

(3)

wherein $R^1$ is methylene, oxygen or sulfur, $R^2$ is a straight, branched or cyclic alkylene group of 1 to 20 carbon atoms which may contain a oxygen, nitrogen or sulfur hetero atom to form a hydroxy, alkoxy, acetyl or ester group, $R^3$ is a fluorinated acid labile group of the following formula (4), "a" is 0 or 1, and "b" is 1 or 2,

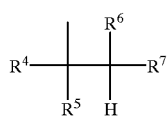

(4)

wherein $R^4$, $R^5$, $R^6$ and $R^7$ each are hydrogen, fluorine, or a straight, branched or cyclic alkyl or fluorinated alkyl group of 1 to 20 carbon atoms, and at least one of $R^4$, $R^5$, $R^6$ and $R^7$ contains fluorine, (B) a photoacid generator, and (C) an organic solvent.

2. The resist composition of claim 1 further comprising a basic compound.

3. The resist composition of claim 1 further comprising a dissolution inhibitor.

4. The resist composition of claim 1 further comprising a dissolution improver.

5. A process for forming a resist pattern comprising the steps of:

applying the resist composition of claim 4 onto a substrate to form a coating, heat treating the coating and then exposing it to radiation having a wavelength below 180 nm through a photo mask, and optionally heat treating the exposed coating and developing it with a developer.

6. The method of claim 5, wherein the radiation is from an $F_2$ excimer with wavelength of 157 nm, a $Kr_2$ excimer with wavelength of 146 nm, a KrAr excimer with wavelength of 134 nm or an $Ar_2$ excimer with wavelength of 121 nm.

7. The method of claim 5, wherein the radiation is from an $F_2$ excimer with wavelength of 157 nm.

8. The composition of claim 1, wherein the base resin polymer contains 20 to 100 mol % of units of the formula (1), (2) or (3).

9. The composition of claim 1, wherein the base resin polymer contains 40 to 100 mol % of units of the formula (1), (2) or(3).

10. The composition of claim 1, wherein the base resin polymer additionally comprises recurring units containing a hydrophilic group to provide adhesion.

11. The composition of claim 1, wherein the base resin polymer additionally comprises recurring units containing an acid labile group which are not of formula (1), (2) or (3).

* * * * *